(12) United States Patent
Chien et al.

(10) Patent No.: US 11,646,377 B2
(45) Date of Patent: May 9, 2023

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Wei-Ting Chien, Hsinchu (TW); Su-Hao Liu, Jhongpu Township (TW); Liang-Yin Chen, Hsinchu (TW); Huicheng Chang, Tainan (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 20 days.

(21) Appl. No.: 17/223,600

(22) Filed: Apr. 6, 2021

(65) Prior Publication Data

US 2022/0059700 A1 Feb. 24, 2022

Related U.S. Application Data

(60) Provisional application No. 63/068,474, filed on Aug. 21, 2020.

(51) Int. Cl.
*H01L 29/78* (2006.01)
*H01L 29/66* (2006.01)
*H01L 21/8234* (2006.01)
*H01L 29/417* (2006.01)

(52) U.S. Cl.
CPC .. *H01L 29/7856* (2013.01); *H01L 21/823418* (2013.01); *H01L 29/41791* (2013.01); *H01L 29/66545* (2013.01); *H01L 29/66803* (2013.01); *H01L 29/66818* (2013.01)

(58) Field of Classification Search
CPC ........... H01L 29/7856; H01L 29/66545; H01L 29/66803; H01L 29/66818; H01L 29/66795; H01L 29/7848; H01L 21/823821; H01L 21/823871; H01L 27/0924; H01L 21/76825; H01L 21/28518; H01L 21/31111; H01L 21/76802;
(Continued)

(56) References Cited

U.S. PATENT DOCUMENTS 9,105,490 B2 8/2015 Wang et al.
9,236,267 B2 1/2016 De et al.
9,236,300 B2 1/2016 Liaw
(Continued)

FOREIGN PATENT DOCUMENTS

TW 201924062 A 6/2019
TW 201942977 A 11/2019
TW 202002012 A 1/2020

OTHER PUBLICATIONS

Knotter, Martin D., et al., "Etching Mechanism of Silicon Nitride in HF-Based Solutions," Journal of the Electrochemical Society, 148 (3) F43-F46 (2001), 4 pages.

*Primary Examiner* — Earl N Taylor
(74) *Attorney, Agent, or Firm* — Slater Matsil, LLP

(57) ABSTRACT

In accordance with some embodiments, a source/drain contact is formed by exposing a source/drain region through a first dielectric layer and a second dielectric layer. The second dielectric layer is recessed under the first dielectric layer, and a silicide region is formed on the source/drain region, wherein the silicide region has an expanded width.

20 Claims, 24 Drawing Sheets

(58) Field of Classification Search
CPC ......... H01L 21/76829; H01L 21/76877; H01L 29/41791
See application file for complete search history.

(56) References Cited

U.S. PATENT DOCUMENTS

| | | |
|---|---|---|
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 9,985,023 B1 | 5/2018 | Liu et al. |
| 10,388,770 B1 * | 8/2019 | Xie .................. H01L 29/41775 |
| 10,658,510 B2 | 5/2020 | Liu et al. |
| 10,763,168 B2 | 9/2020 | Hsieh et al. |
| 11,145,751 B2 | 10/2021 | Chen et al. |
| 2009/0140350 A1 | 6/2009 | Zhu |
| 2015/0084134 A1 * | 3/2015 | Lin ..................... H01L 27/0266 257/401 |
| 2016/0043035 A1 * | 2/2016 | Lin ....................... H01L 23/485 438/653 |
| 2016/0308016 A1 * | 10/2016 | Choi .................... H01L 29/7845 |
| 2017/0162576 A1 * | 6/2017 | Kim ................. H01L 21/823814 |
| 2017/0294508 A1 * | 10/2017 | Hsu ..................... H01L 29/0847 |
| 2018/0108575 A1 * | 4/2018 | Li ................... H01L 21/823871 |
| 2018/0254246 A1 * | 9/2018 | Park .................. H01L 23/53204 |
| 2018/0308952 A1 * | 10/2018 | Adusumilli ....... H01L 21/28518 |
| 2020/0020773 A1 * | 1/2020 | Choi ................. H01L 29/41791 |
| 2020/0135476 A1 | 4/2020 | Huang et al. |
| 2020/0135546 A1 | 4/2020 | Wang et al. |
| 2020/0135858 A1 * | 4/2020 | Chiu .................. H01L 21/76876 |
| 2020/0176260 A1 * | 6/2020 | Hung ................. H01L 21/02274 |
| 2022/0059700 A1 * | 2/2022 | Chien ............... H01L 29/66818 |

* cited by examiner

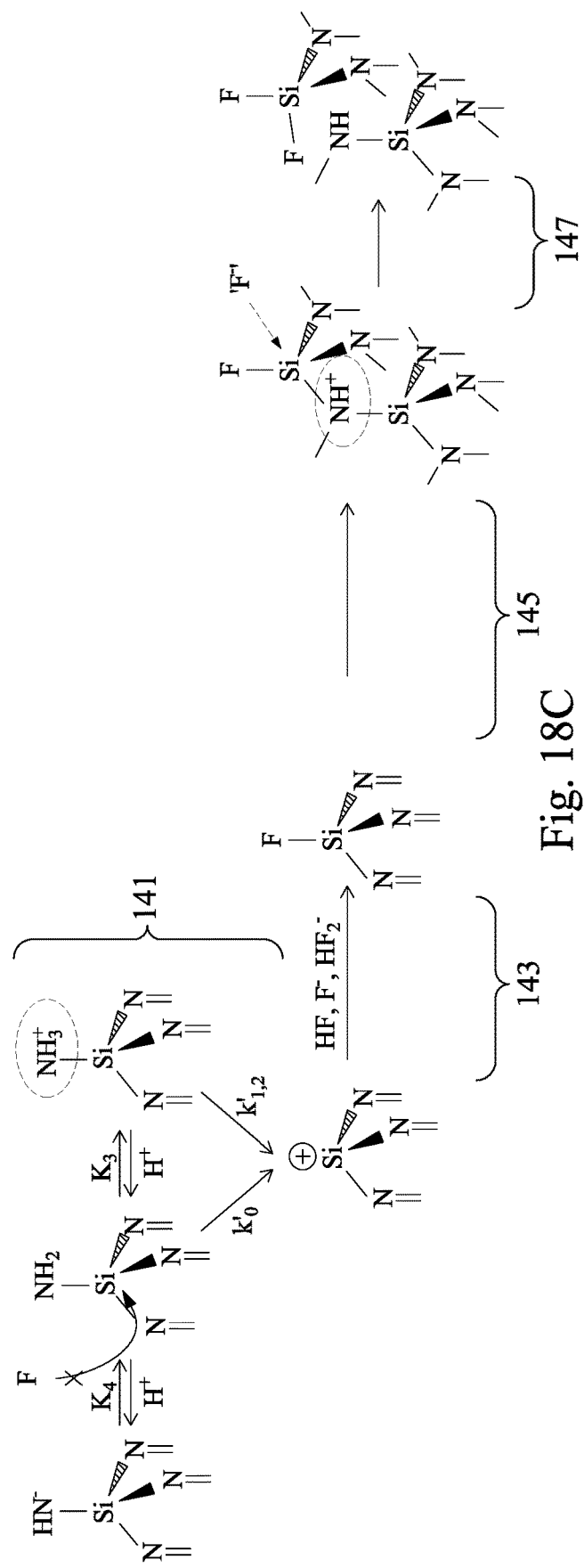
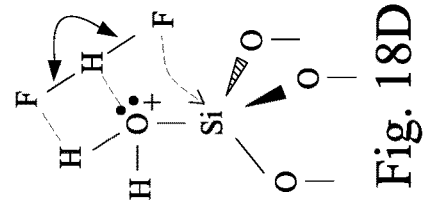
Fig. 18C
Fig. 18D

SEMICONDUCTOR DEVICE AND METHOD OF MANUFACTURE

PRIORITY CLAIM AND CROSS-REFERENCE

This application claims the benefit of U.S. Provisional Application No. 63/068,474, filed on Aug. 21, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 10C, 10D, 11A, 11B, 12A, 12B, 13A, 13B, 14A, 14B, 14C, 15A, 15B, 16A, 16B, 17A, 17B, 17C, 18A, 18B, 18C, 18D, 19A 19B, 20A, and 20B are cross-sectional views of intermediate stages in the manufacturing of FinFETs, in accordance with some embodiments.

DETAILED DESCRIPTION

Figure 1:
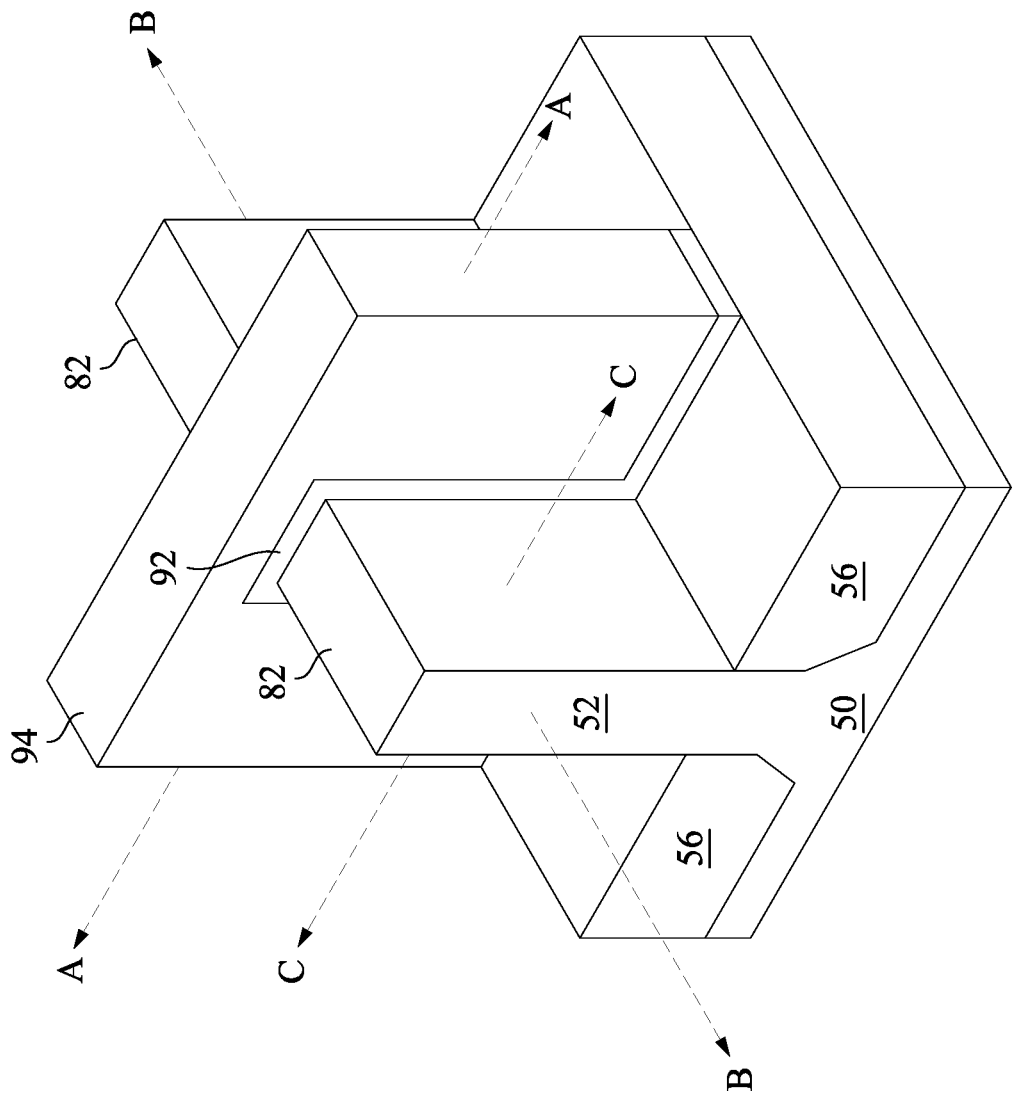
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a particular embodiment in which a source/drain contact is formed to a fin field effect transistor (FinFET). However, the embodiments are not limited to this precise description, as the ideas presented herein are applicable in a wide variety of embodiments, all of which are fully intended to be included within the scope of the embodiments.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 20B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, 14A, and 15A are illustrated along reference cross-section A-A illustrated in FIG. 1, and FIGS. 8B, 9B, 10B, 11B, 12B, 13B, 14B, 14C, 15B, 16A, 16B, 17A, 17B, 17C, 18A, 18B, 19A, 19B, 20A, and 20B are illustrated along a similar cross-section B-B illustrated in FIG. 1, except for multiple fins/FinFETs. FIGS. 10C and 10D are illustrated along reference cross-section C-C illustrated in FIG. 1, except for multiple fins/FinFETs.

Figure 2:
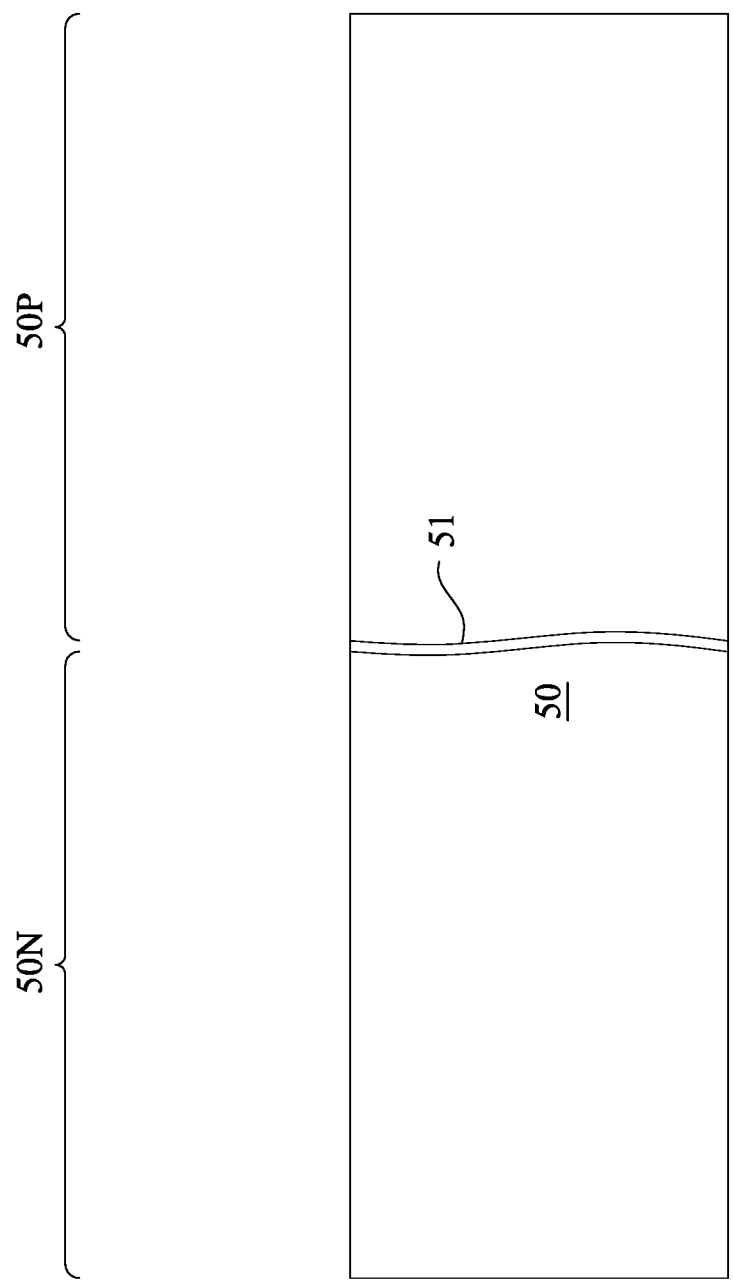

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
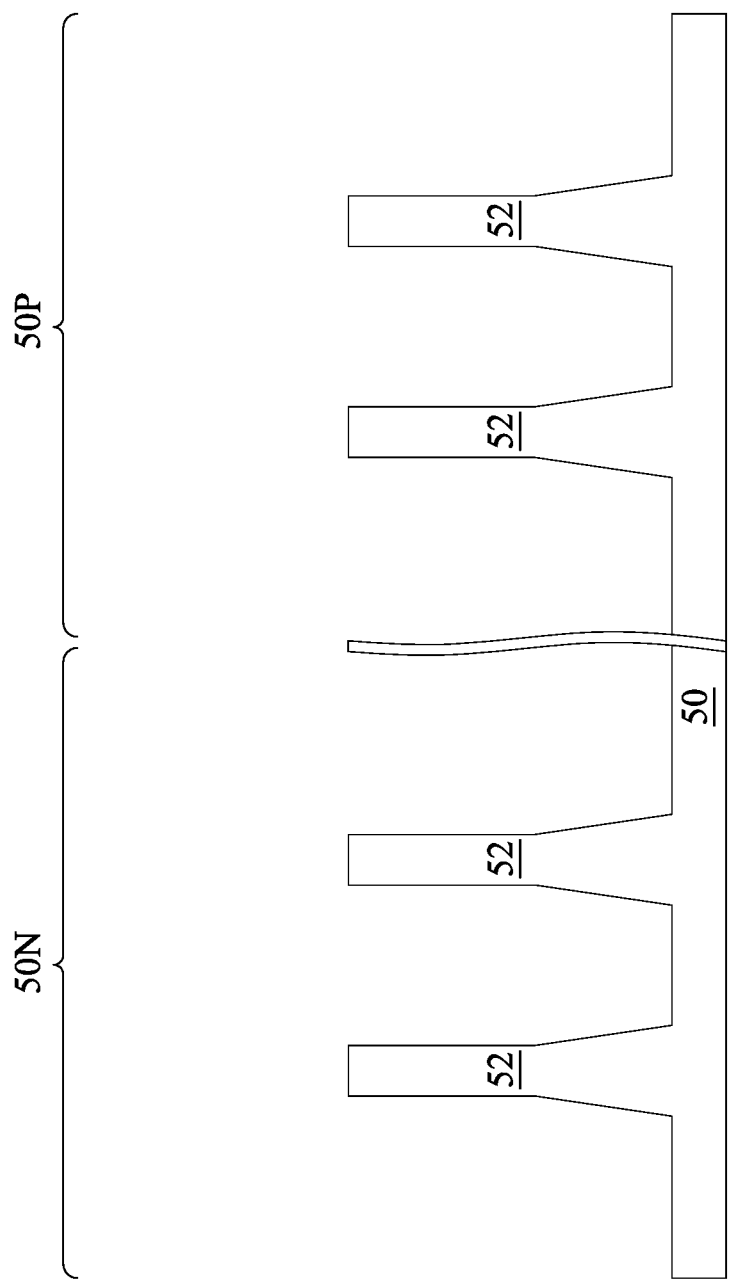

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
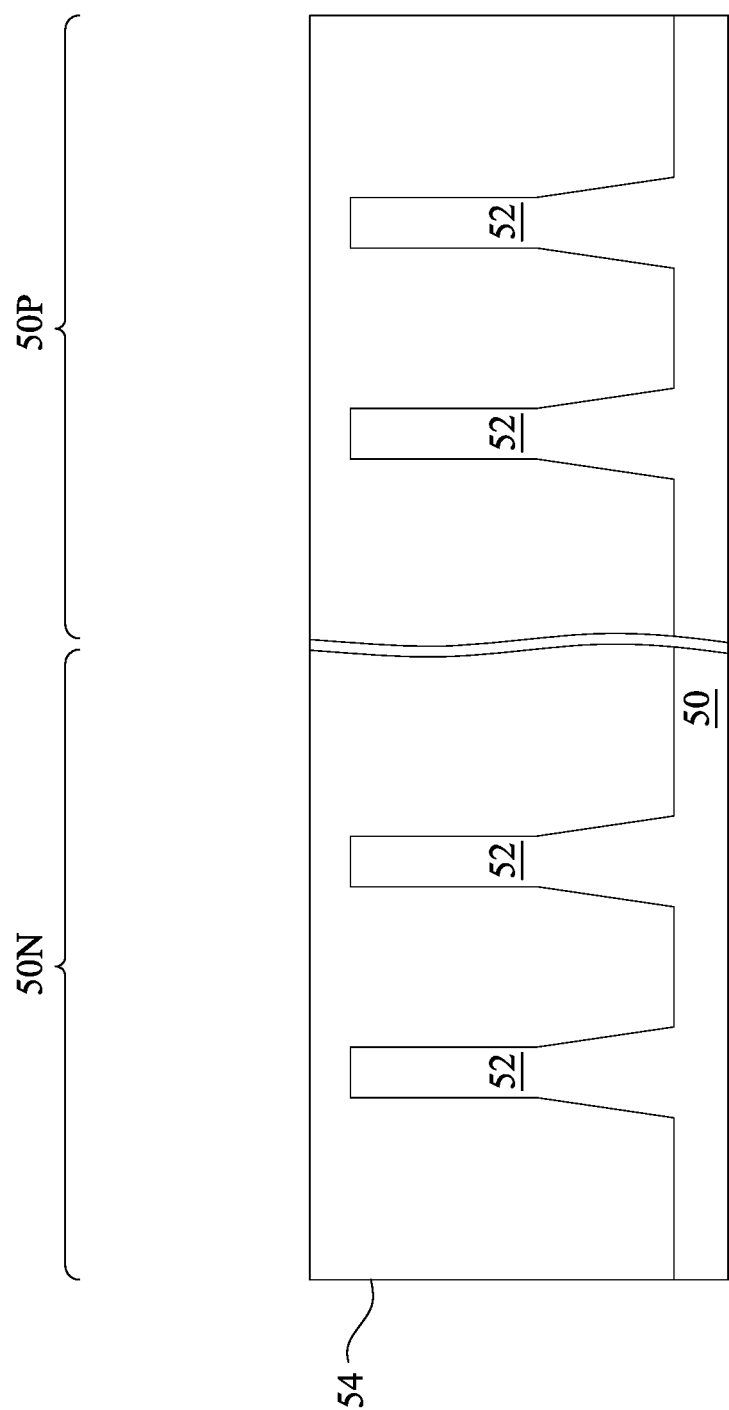

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
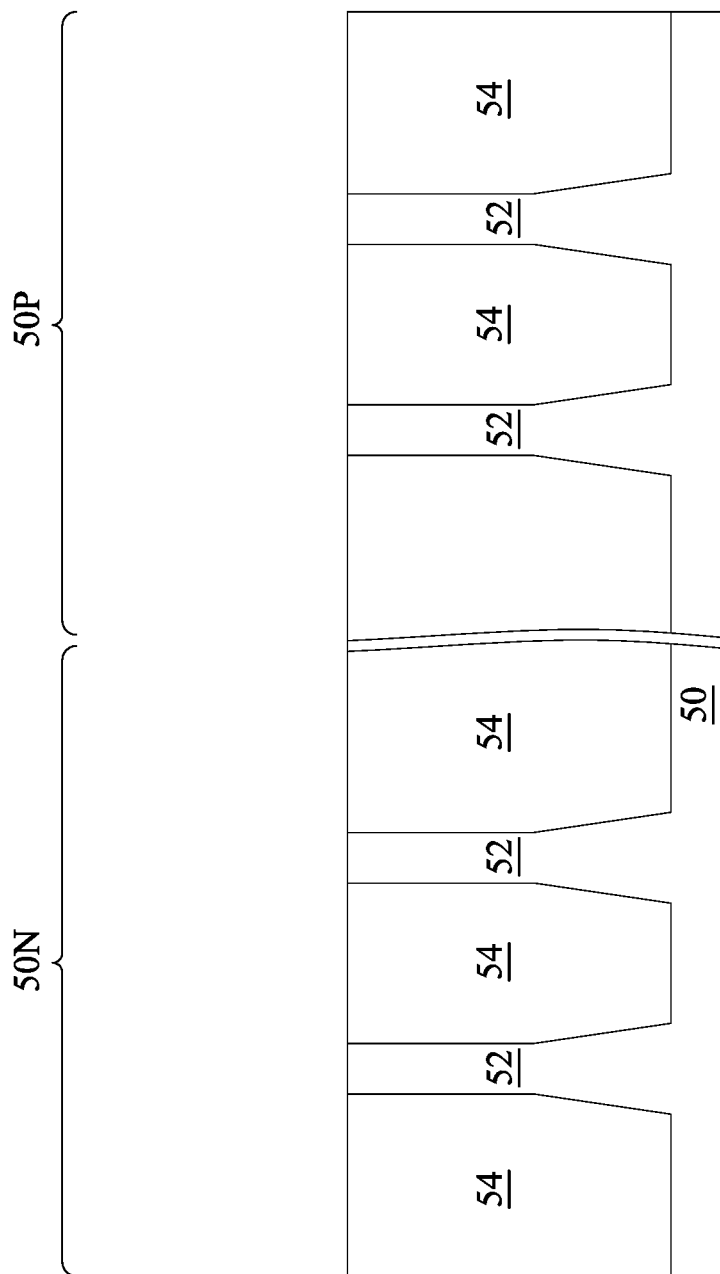

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
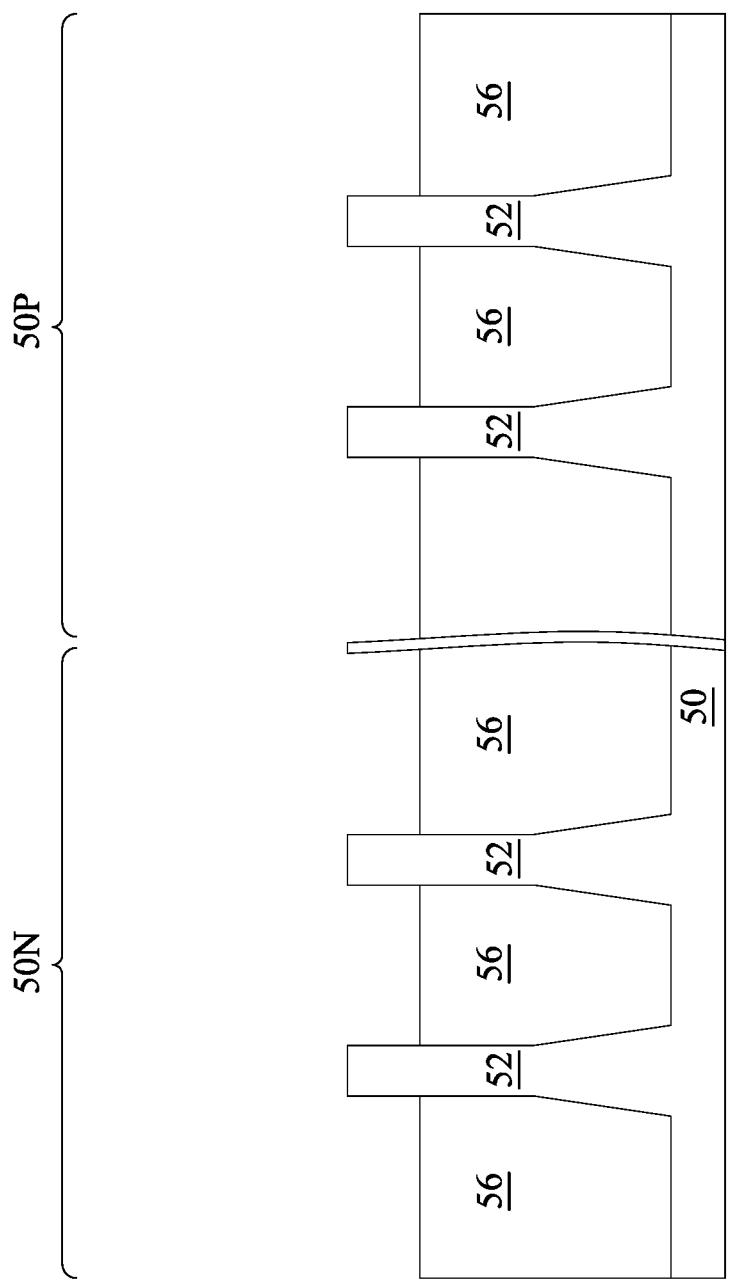

In FIG. 6, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
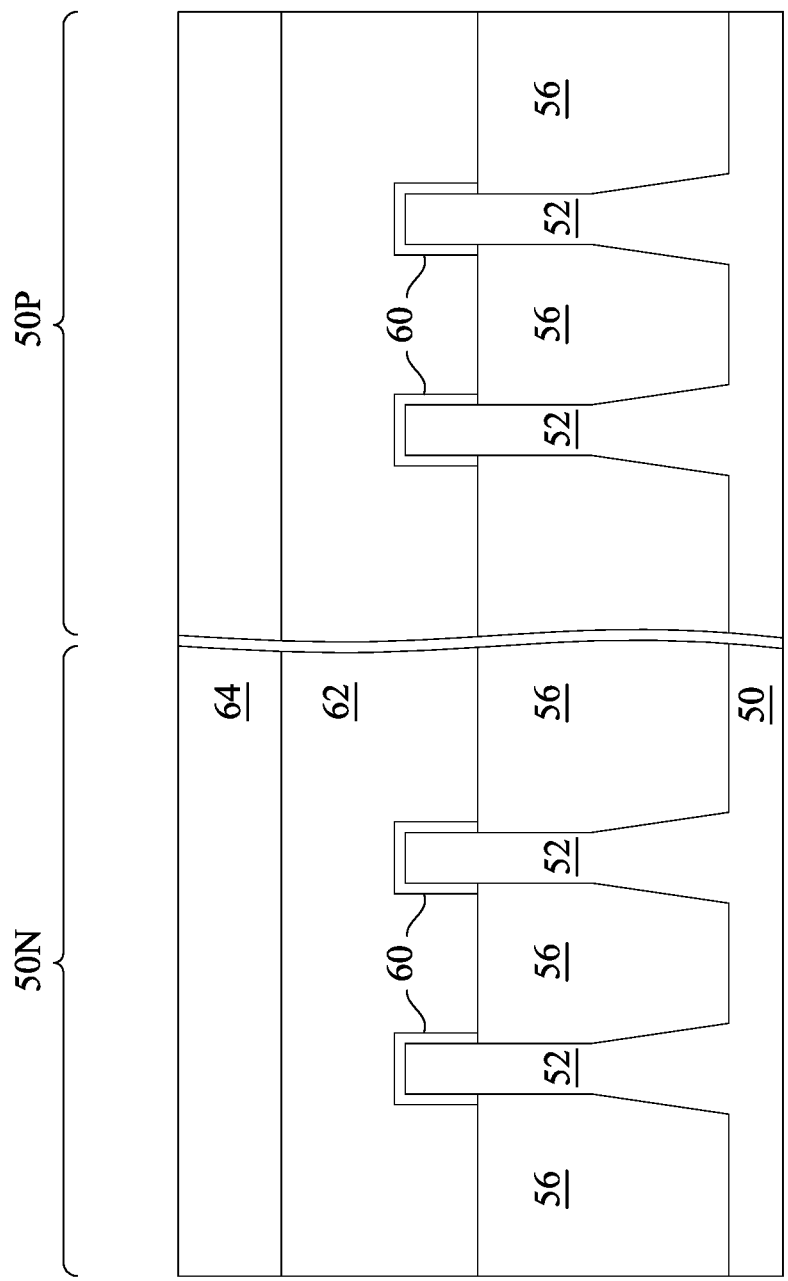

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

FIGS. 8A through 20B illustrate various additional steps in the manufacturing of embodiment devices. FIGS. 8A through 20B illustrate features in either of the n-type region 50N and the p-type region 50P. For example, the structures illustrated in FIGS. 8A through 20B may be applicable to both the n-type region 50N and the p-type region 50P. Differences (if any) in the structures of the n-type region 50N and the p-type region 50P are described in the text accompanying each figure.

Figure 8B:
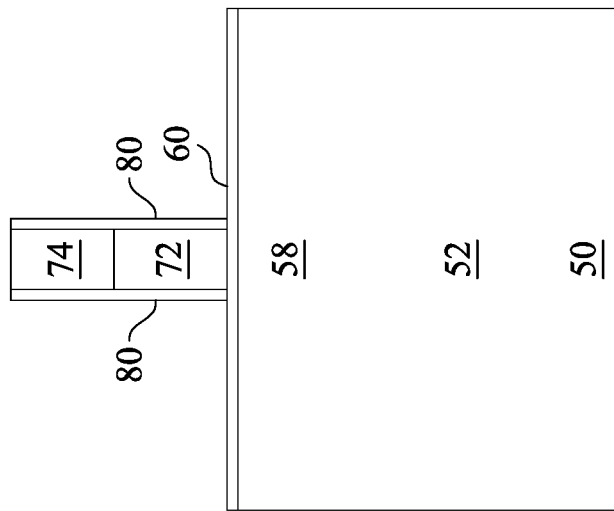
Figure 8A:
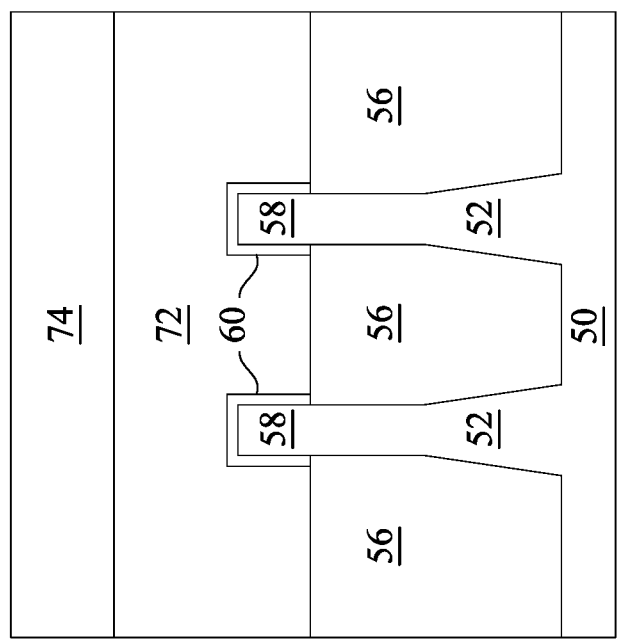

In FIGS. 8A and 8B, the mask layer 64 (see FIG. 7) may be patterned using acceptable photolithography and etching techniques to form masks 74. The pattern of the masks 74 then may be transferred to the dummy gate layer 62 to form dummy gates 72. In some embodiments (not illustrated), the pattern of the masks 74 may also be transferred to the dummy dielectric layer 60 by an acceptable etching technique. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9B:
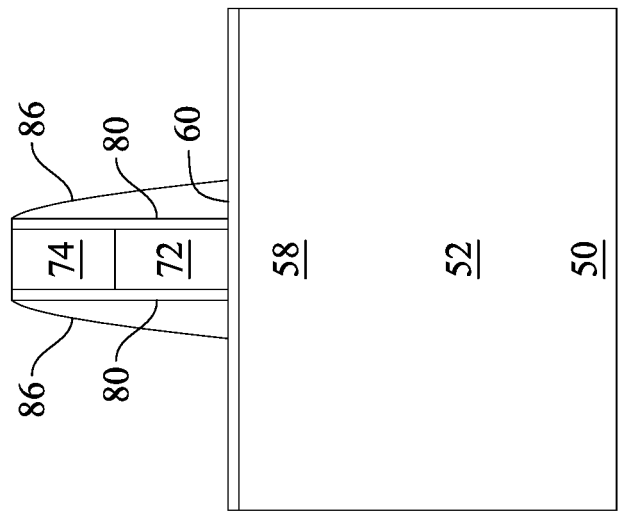
Figure 9A:
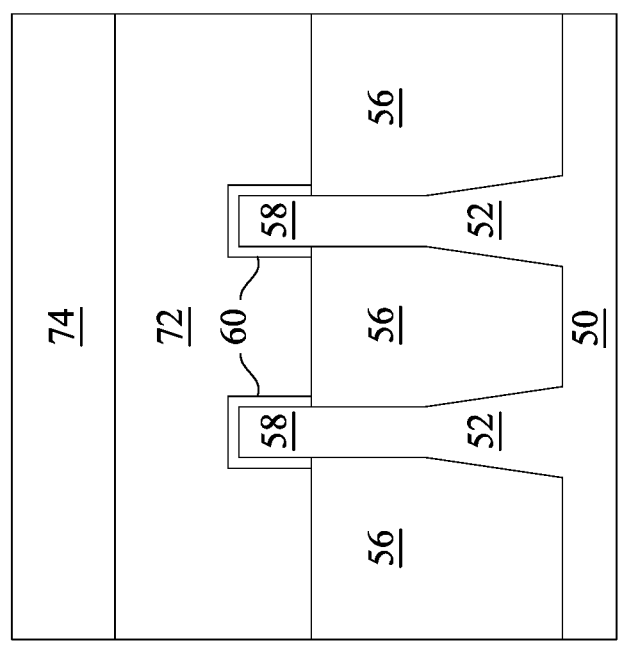

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10B:
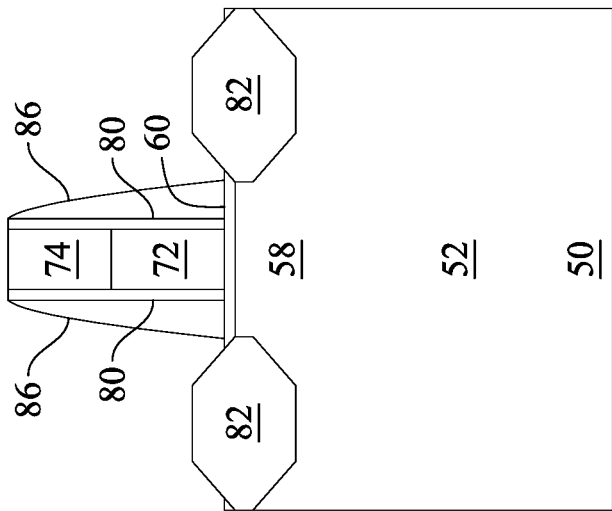
Figure 10A:
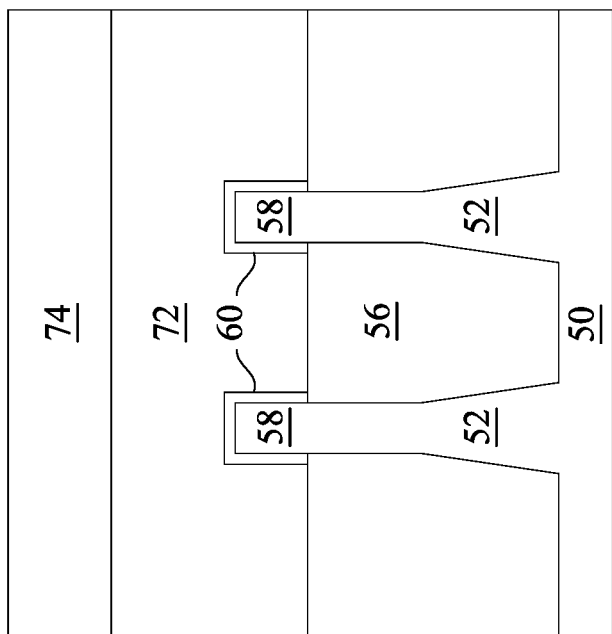
Figure 10C:
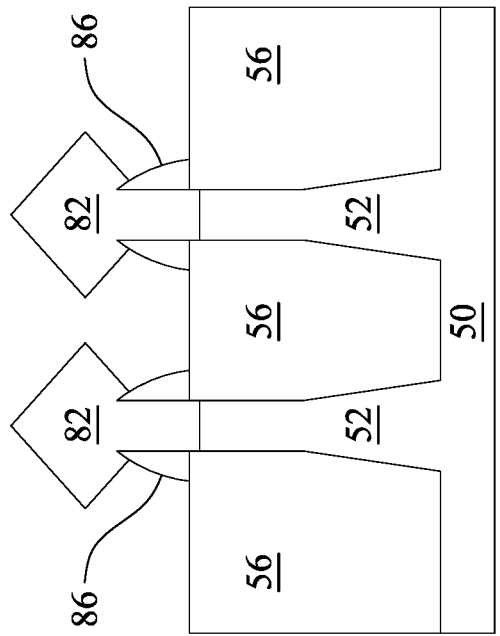
Figure 10D:
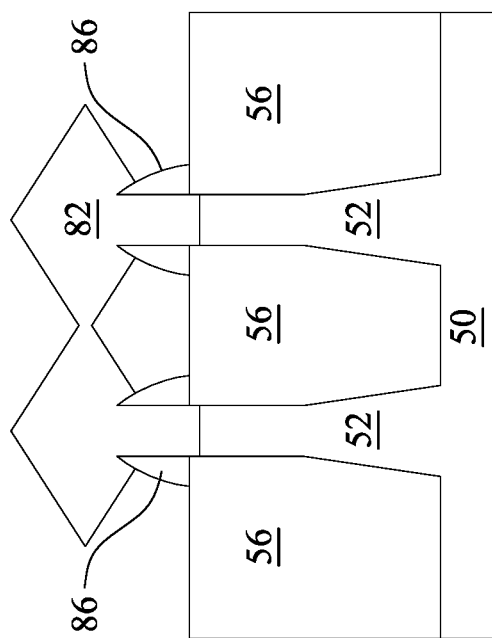

In FIGS. 10A and 10B epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 10C. In other embodiments, adjacent source/drain regions 82 remain separated after the epitaxy process is completed as illustrated by FIG. 10D. In the embodiments illustrated in FIGS. 10C and 10D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 11B:
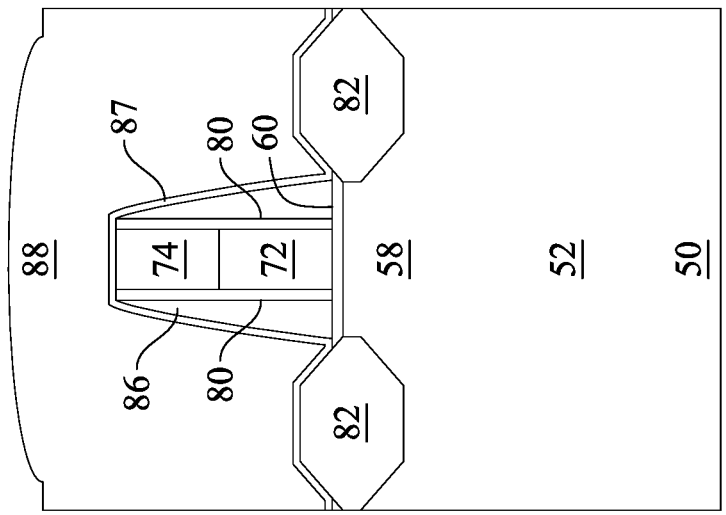
Figure 11A:
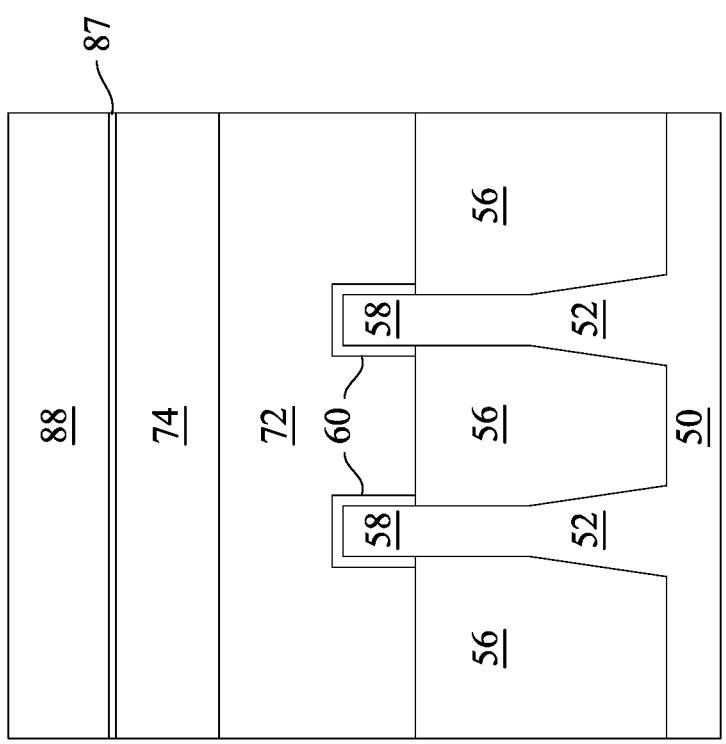

In FIGS. 11A and 11B, a first interlayer dielectric (ILD) 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include silicon oxide, phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 12B:
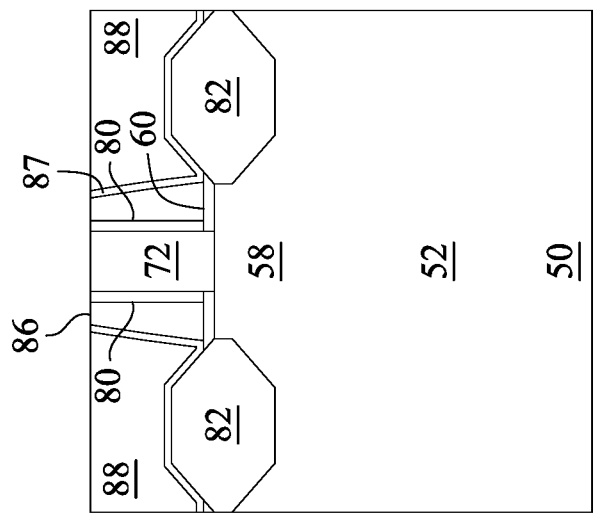
Figure 12A:
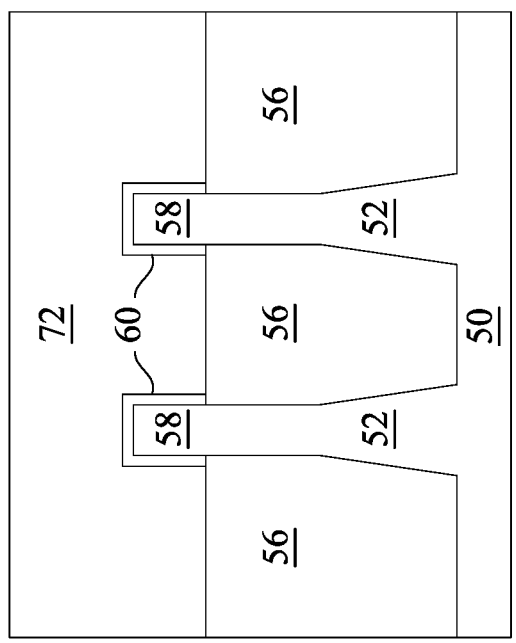

In FIGS. 12A and 12B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surface of the masks 74.

Figure 13B:
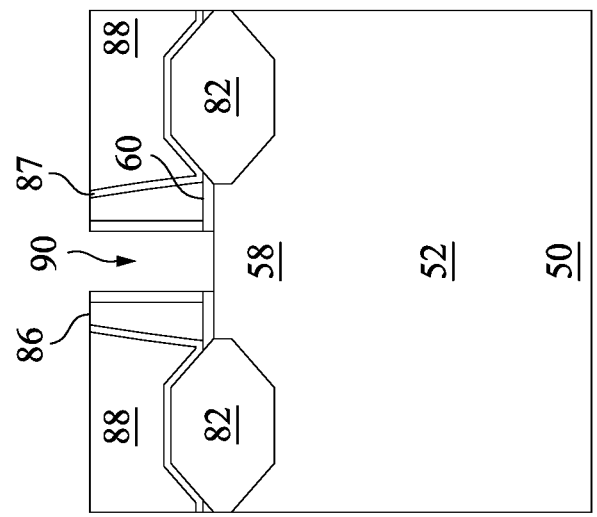
Figure 13A:
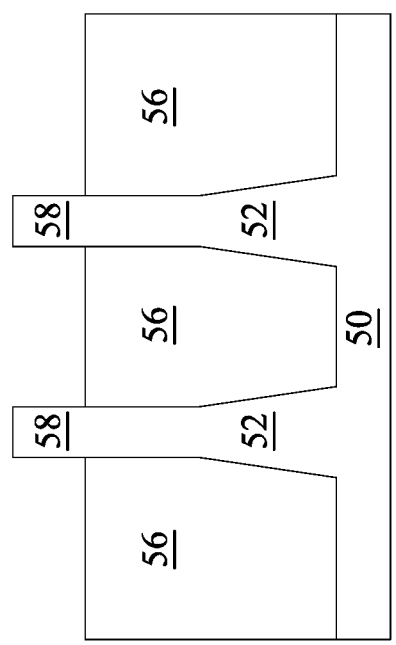

In FIGS. 13A and 13B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 14B:
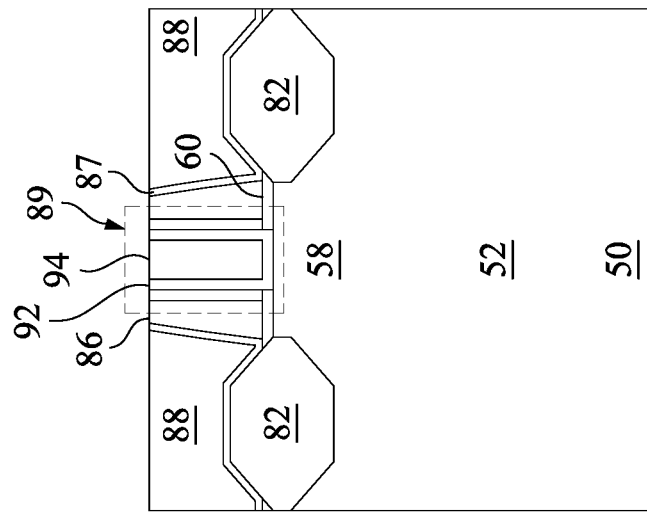
Figure 14A:
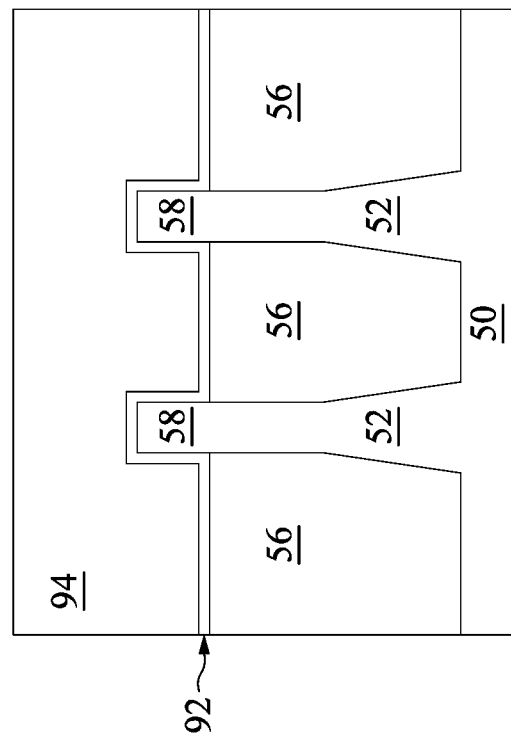
Figure 14C:
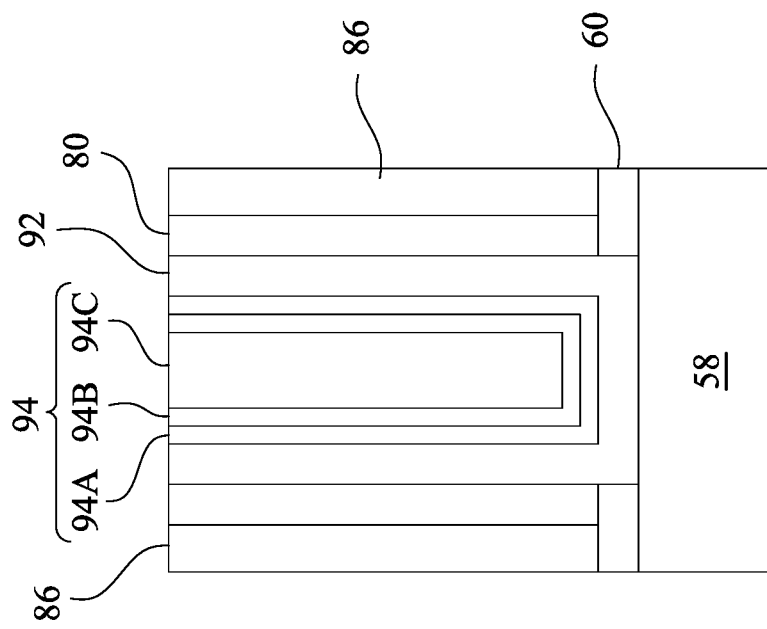

In FIGS. 14A and 14B, gate dielectric layers 92 and gate electrodes 94 are formed for replacement gates. FIG. 14C illustrates a detailed view of region 89 of FIG. 14B. Gate dielectric layers 92 include one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy dielectric layer 60 remains in the recesses 90, the gate dielectric layers 92 include a material of the dummy dielectric layer 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 14B, the gate electrode 94 may comprise any number of liner layers 94A, any number of work function tuning layers 94B, and a fill material 94C as illustrated by FIG. 14C. After the filling of the recesses 90, a planarization process, such as a CMP, may be performed to remove the excess portions of the gate dielectric layers 92 and the material of the gate electrodes 94, which excess portions are over the top surface of the first ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 15B:
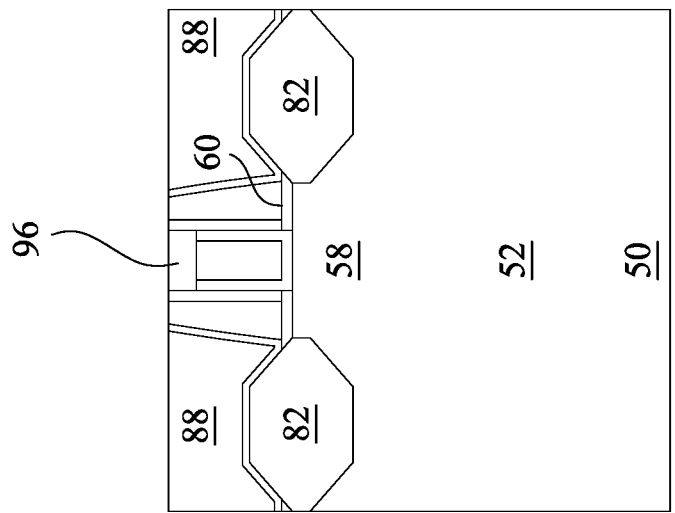
Figure 15A:
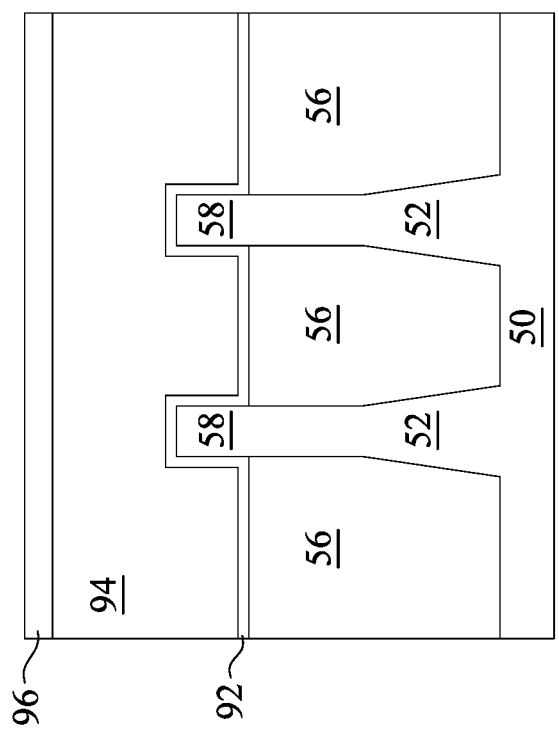

In FIGS. 15A and 15B, a gate mask 96 is formed over the gate stack (including a gate dielectric layer 92 and a corresponding gate electrode 94), and the gate mask also may be disposed between opposing portions of the gate spacers 86. In some embodiments, forming the gate mask 96 includes recessing the gate stack so that a recess is formed directly over the gate stack and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88.

Figure 16B:
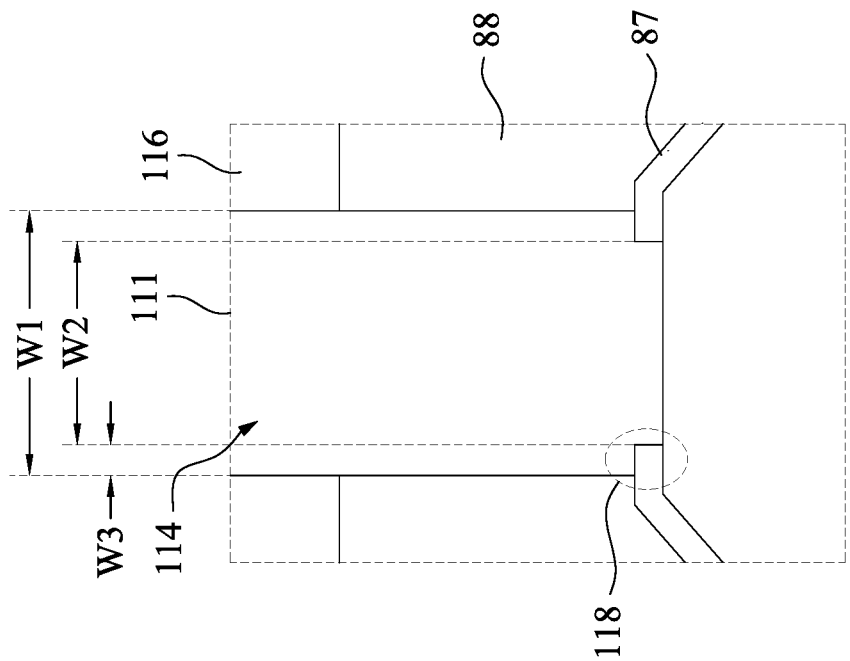
Figure 16A:
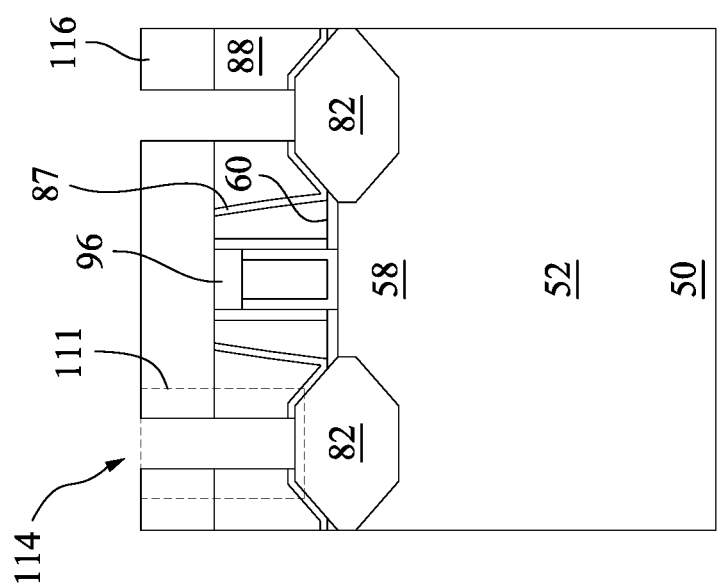

In FIGS. 16A and 16B, and looking more closely at the structure of FIG. 15A, source/drain contacts 112 (seen in completed form in FIGS. 19A-19B below) are formed through the first ILD 88 and the CESL 87 in accordance with some embodiments, with FIG. 16B illustrating a close up view of the area within the dashed line 111 within FIG. 16A. In an embodiment the process of forming the source/drain contacts 112 can be initiated by initially forming source/drain contact openings 114 to expose the source/drain regions 82. In an embodiment the formation of the source/drain contact openings 114 may be initiated by placing a hard mask 116 over the first ILD 88. The hard mask 116 may be a hard mask material such as silicon nitride, silicon oxide, combinations of these, or the like, and may be deposited to a thickness of between about 20 nm and about 100 nm. However, any suitable material and any suitable thickness may be utilized.

Once the hard mask 116 has been deposited, the hard mask 116 may be patterned. In an embodiment the hard mask 116 may be patterned using a photolithographic masking and etching process, whereby a photosensitive material is placed, exposed, and developed, and the developed photosensitive material is then utilized as a mask during an anisotropic etching process to pattern the hard mask 116 in the desired pattern for the source/drain contact openings 114. The photosensitive material may then be removed using, e.g., an ashing and/or stripping process.

After the hard mask 116 has been patterned, the hard mask 116 may be utilized to form the source/drain contact openings 114 through the first ILD 88. In an embodiment the source/drain contact openings 114 may be formed using an anisotropic etching process, such as a reactive ion etching process with etchants selective to the material of the first ILD 88, to etch away the material of the first ILD 88 until the etching process is stopped by the CESL 87. However, any suitable etching process may be utilized.

Once the CESL 87 has been exposed, another etching process may be performed to punch through the CESL 87 and expose the underlying source/drain regions 82. In an embodiment the punch through may be performed using another anisotropic etching process, such as a reactive ion etching process with etchants selective to the material of the CESL 87, to etch away the material of the CESL 87 until the source/drain region 82 has been exposed. However, any suitable etching process may be utilized.

At the end of the punch through process to extend the source/drain contact openings 114 through the CESL 87, the source/drain contact openings 114 may have multiple widths due to the different etching processes and different selectivities during the different etching processes. For example, as the source/drain contact openings 114 extend through the first ILD 88, the source/drain contact openings 114 will have a first width W1 of between about 20 nm and about 45 nm. Additionally, the source/drain contact openings 114 can have a second width W2 through the CESL 87 that is less than the first width W1, such as the second width W2 being between about 16 nm and about 40 nm. However, any suitable widths may be utilized.

Given that the source/drain contact openings 114 have a different (e.g., smaller) width as they extend through the CESL 87 than through the first ILD 88, the CESL 87 can have extensions 118 which extend beyond the sidewalls of the first ILD 88, which may also be known as "protruding and remaining bottom side wall dielectric films" or "bottom footing dielectric films". In some embodiments the extensions 118 of the CESL 87 may have a third width W3 of between about 4 nm and about 8 nm. However, any suitable widths may be utilized.

Figure 17B:
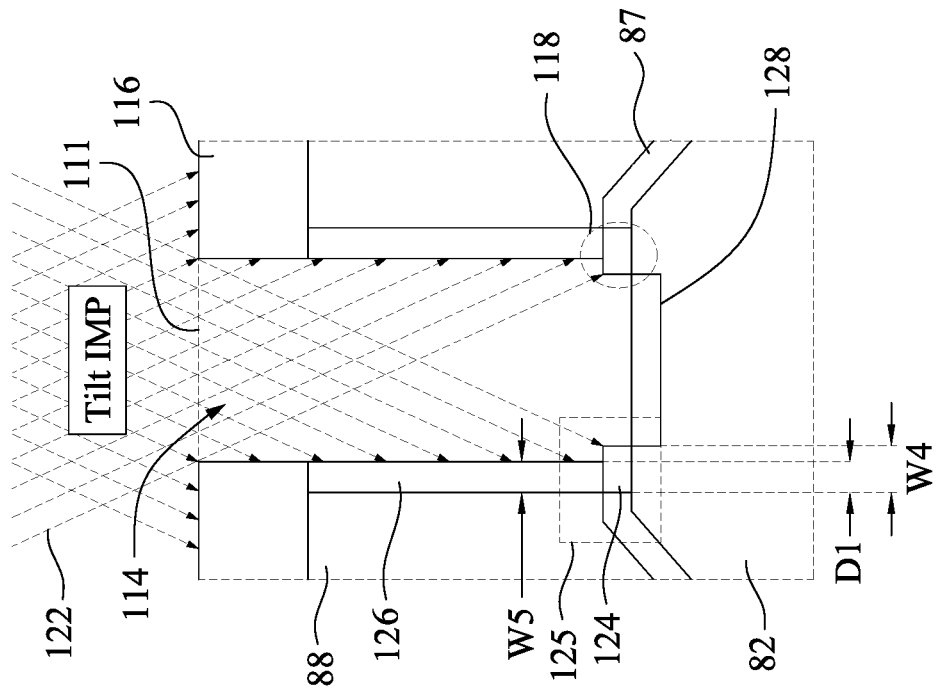
Figure 17A:
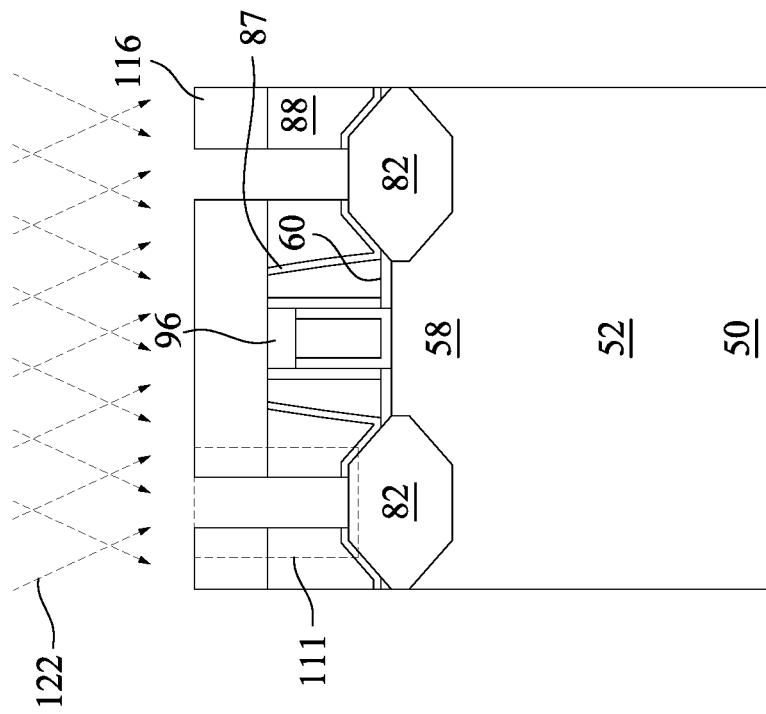
Figure 17C:
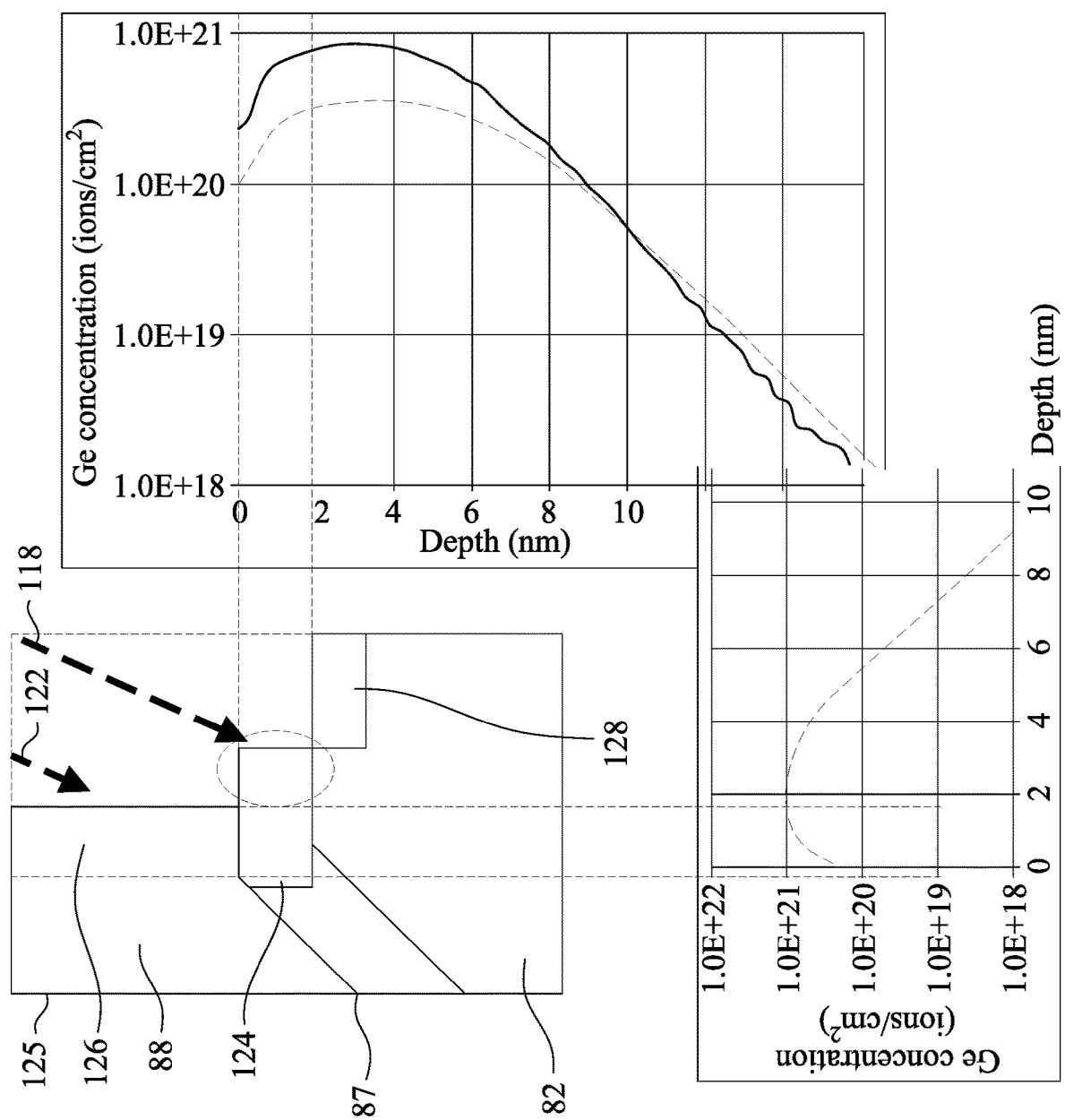

FIGS. 17A-17C illustrate a first implantation process 122 which may be utilized to help modify the etching selectivity of the CESL 87 so that a subsequent etching process (e.g., a subsequent cleaning process 129 described below with respect to FIGS. 18A-18B) removes the extensions 118. In some embodiments an optional pre-clean may be performed by applying and then removing a mixture of $NF_3/NH_3$ (NSPE) and $HF/NH_3$ (HPP). However, any suitable cleaning process may be utilized.

In an embodiment the first implantation process 122 is performed in order to implant first dopants into the extensions 118 of the CESL 87. In an embodiment the first dopants may be dopants which will damage the material of the extensions 118 of the CESL 87 without significantly modifying the material's other properties. As such, in an embodiment the first dopants may be germanium, boron (B), arsenic (As), phosphorous (P), combinations of these, or the like. However, any suitable dopant or combination of dopants may be utilized.

In an embodiment the first dopants may be implanted into the extensions 118 of the CESL 87 using a process such as a first implantation process (represented in FIG. 17B by the arrows labeled 122), whereby ions of the desired first dopants are accelerated and directed towards the extensions 118 of the CESL 87. The ion implantation process may utilize an accelerator system to accelerate ions of the desired first dopant at a first dosage concentration. As such, while the precise dosage concentration utilized will depend at least in part on the extensions 118 of the CESL 87 and the first dopants used, in one embodiment the accelerator system may utilize an energy of between about 500 eV and about 10 keV (e.g., 5.2 keV or 5.0 keV) along with a dosage concentration of about $1 \times 10^{13}$ atoms/cm$^2$ to about $2 \times 10^{14}$ atoms/cm$^2$, such as about $8.5 \times 10^{13}$ atoms/cm$^2$.

Additionally, the first dopants may be implanted perpendicular to the source/drain regions 82 or else at, e.g., an angle of between about 0° and about 60°, from perpendicular to the extensions 118 of the CESL 87, and may be implanted at a temperature of between about 100° C. and about 500° C. Further, in an embodiment the first dopants may be implanted within the extensions 118 of the CESL 87 to a concentration of between about 1E13 atom/cm$^2$ and about 5E14 atom/cm$^2$. However, any suitable parameters may be utilized.

The first implantation process 122 may be performed by any suitable number of implantations. For example, in one embodiment two separate implantations may be performed in order to implant the first dopants into each of the extensions 118, or more than two implants may be utilized. In other embodiments, a single implant may be performed, for example, in which the substrate 50 is rotated during the single implantation. Any suitable number of implants may be utilized, and all such implants are fully intended to be included within the scope of the embodiments.

By implanting the first dopants into the extensions 118 of the CESL 87, the damage done to the extensions 118 of the CESL 87 will help to increase the etching rate during subsequent etching processes. In particular, the damage done by the first implantation process 122 allows subsequent etching solutions to penetrate into the CESL 87 instead of remaining only on a surface of the CESL 87. As such, with a larger surface area of contact, the etching solutions will remove the material of the CESL 87 at a greater rate than if the first implantation process 122 is not performed.

Additionally, because in some embodiments the first implantation process 122 is performed at an angle, the first dopants will actually impact the extensions 118 of the CESL 87 and then travel to a location which is actually beneath the first ILD 88. As such, the first implantation process 122 will create a first implantation region 124 within the extensions 118 of the CESL 87 that has a fourth width W4 of between about 4 nm and about 8 nm, while the first implantation region 124 extends beneath the first ILD 88 a first distance D1 of between about 1 nm and about 3 nm. However, any suitable widths and distances may be utilized.

However, in addition to simply implanting the first dopants into the extensions 118 of the CESL 87, the first implantation process 122 will additionally implant the first dopants into sidewalls of the first ILD 88. As such, a second implantation region 126 may be formed along sidewalls of the first ILD 88, and the second implantation region 126 may have a fifth width W5 of between about 1 nm and about 3 nm, and may have a concentration of the first dopants of between about 1E20 atom/cm$^2$ and about 1E21 atom/cm$^2$. However, any suitable width and any suitable concentration may be utilized.

In embodiments in which the first ILD 88 is an oxide material such as silicon oxide, the first implantation process 122 will additionally cause some oxygen atoms within the oxide to become dislodged from the first ILD 88. Once dislodged and present in the ambient atmosphere, the oxygen atoms may then react with an exposed portion of the CESL 87, thereby oxidizing a portion of the material of the CESL 87 (e.g., silicon nitride). Such an oxidation can further increase the rate of reaction during subsequent processing.

Finally, during the first implantation process 122 some of the first dopants may indirectly be implanted into the source/drain region 82. For example, in embodiments in which the first implantation process 122 is performed with a tilted implant, while there may be no direct implantation into the source/drain region 82, some of the first dopants within the ambient atmosphere may diffuse into the source/drain region 82 through, e.g., an indirect implantation process. As such, there may be a third implantation region 128 located within the source/drain region 82. However, because this is an indirect implantation instead of a direct implantation, the depth and concentration of the third implantation region 128 is less than the depth and concentration of either the first implantation region 124 or the second implantation region 126.

FIG. 17C illustrates a close up view of the dashed box 125 in FIG. 17B which illustrates the extension 118 of the CESL 87 after the first implantation process 122 has been completed, along with a first chart of the germanium concentration within the extensions 118 as well as a second chart illustrating the germanium concentration within the second implantation region 126. As can be seen, the first implantation process 122 implants the first dopant (e.g., germanium) into the extension 118 of the CESL 87 so that there is a concentration gradient of germanium in which the concentration of germanium increases from a top surface of the extension 118 of the CESL 87. However, any suitable concentration gradient may be utilized.

Figure 18B:
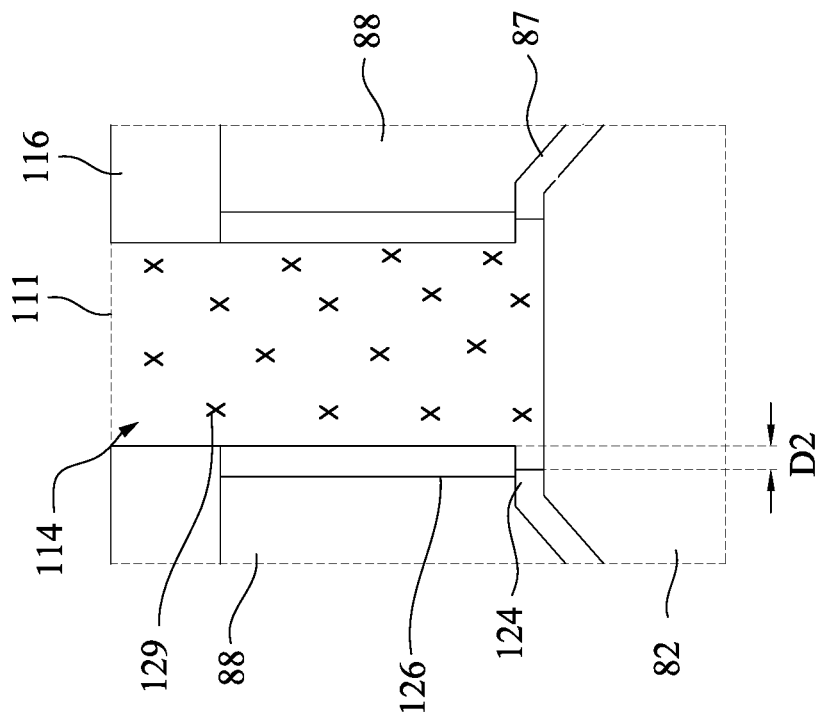
Figure 18A:
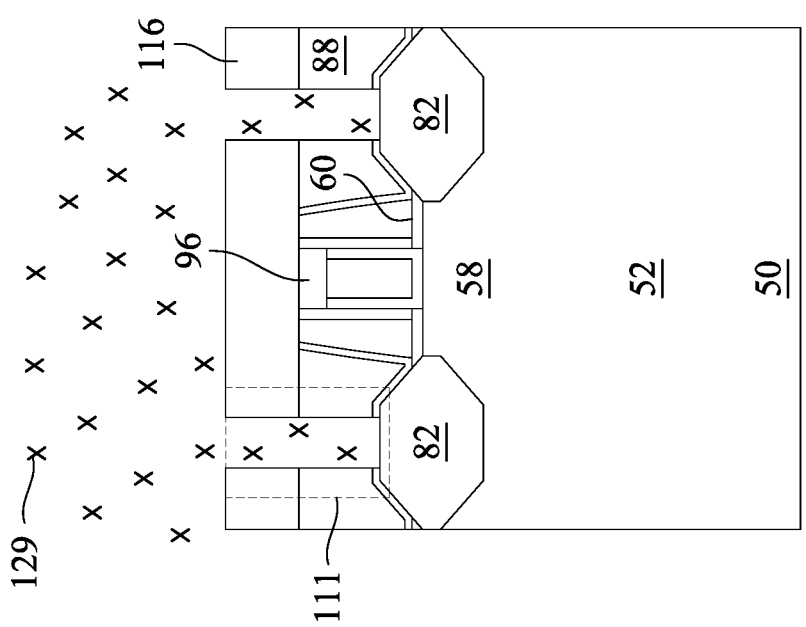

FIGS. 18A-18B illustrate a cleaning process (represented in FIGS. 18A-18B by the "X"s labeled 129) which may be used after the first implantation process 122 in order to remove any leftover material and prepare the source/drain contact openings 114 for filling. In an embodiment the cleaning process 129 may be a wet etching process using a wet etching solution such as dilute hydrofluoric acid, $NH_3$, $NF_3$, combinations of these, or the like. However, any suitable etchant may be utilized.

In an embodiment the wet etching solution may be placed in contact with both the first ILD 88 and the CESL 87. In an embodiment the wet etching solution may be placed using a dip method, a spray on method, a puddle method, combinations of these, or the like. During the etching process, the wet etching solution may be kept at a temperature of between about 25° C. and about 200° C., for a time of between about 0.5 min and about 5 min. However, any suitable process conditions may be utilized.

During the cleaning process 129 the wet etching solution will preferentially react with and etch the material of the CESL 87 over the material of the first ILD 88. Additionally, with the damage caused by the implantation of the first dopants (e.g., germanium), the etching rate of the cleaning process 129 with respect to the CESL 87 will also be increased, such as increased greater than three times with respect to an etching rate that would be present if the first implantation process 122 was not performed. For example, in an embodiment in which the CESL 87 is silicon nitride and the wet etchant is dilute hydrofluoric acid, the etching rate without the first implantation process 122 may be about 5.5 Å, while the use of the first implantation process 122 can increase this reaction rate to about 15.9 Å (without also significantly impacting the reaction rate of anisotropic etching processes).

As such, in addition to simply removing debris or any material leftover from the previous etching processes, the cleaning process 129 will additionally recess the material of the CESL 87 below the first ILD 88. In some embodiments the material of the CESL 87 may be recessed to a second distance D2 of between about 0.5 nm and about 3 nm. As such, the overall amount of material from the CESL 87 that remains is reduced from about 8.3 nm to about 2.4 nm or even 1.9 nm. However, any suitable distance may be utilized.

Additionally, while in some embodiments the first implantation region 124 may be completely removed, this is intended to be illustrative and is not intended to be limiting. In particular, in other embodiments a portion of the first implantation region 124 may remain after the cleaning process 129 has been completed. In such an embodiment the remaining portion of first implantation region 124 within the CESL 87 may have a germanium concentration of between about $3 \times 10^{20}$ ions/$cm^2$ and about $5 \times 10^{20}$ ions/$cm^2$. However, any suitable concentration may be utilized.

FIG. 18C illustrates one possible chemical reaction mechanism between the material of the CESL 87 and the wet etching solution when dilute hydrofluoric acid is utilized during the cleaning process 129 and the material of the CESL 87 is silicon nitride. In this embodiment, there is a first reaction step 141, such as an initial protonation step, in which fluorine atoms and hydrogen atoms attack and remove one of the nitrogen atoms within the silicon nitride. Once one of the nitrogen atoms has been removed, a second reaction 143, such as a unimolecular, substitution, nucleophilic reaction (e.g., an SN1 reaction) occurs whereby a fluorine atom replaces the nitrogen atom that was previously removed. In a third reaction step 145, another protonation reaction occurs, and in a fourth reaction step 147, a bimolecular, substitution, nucleophilic reaction (e.g., an SN2 reaction) occurs, resulting in a removal of the silicon nitride.

FIG. 18D illustrates one possible chemical reaction mechanism between the material of the first ILD 88 (e.g., silicon oxide) and the wet etching solution (e.g., dilute hydrofluoric acid). In this embodiment the silicon oxide, with a free lone pair of electrons, reacts with the dimer form of hydrofluoric acid (e.g., F—H—F), whereas the protonated form of silicon nitride, which does not have a free lone pair of electrons, will not react with the dimer form of hydrofluoric acid. As such, the material of the first ILD 88 will react at a slower rate than the material of the CESL 87.

By performing the first implantation process 122 prior to the wet etching of the cleaning process 129, the damage caused by the first implantation process 122 helps to increase the etching efficiency during the cleaning process 129. In particular, the damage to the material allows the etching chemicals to intrude into the materials being etched, increasing the surface area in contact with the etchants. As such, the cleaning process 129 can be used to not only remove extra debris, but can also be utilized in order to expand the opening in preparation for subsequent steps.

Figure 19B:
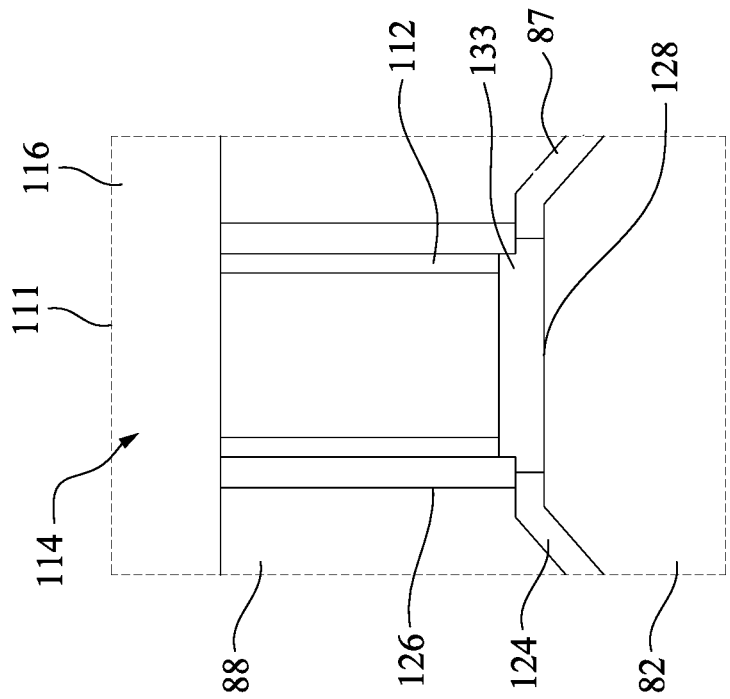
Figure 19A:
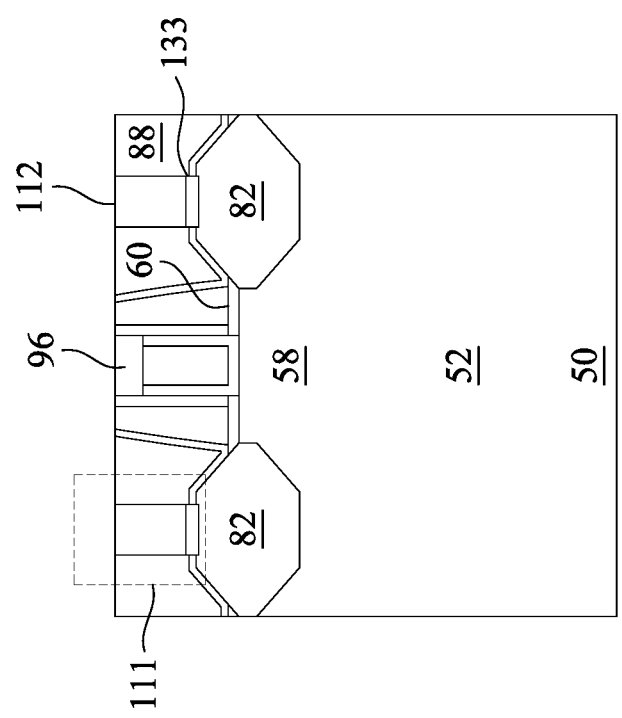

FIGS. 19A-19B illustrate a formation of a silicide region 133 and a filling of the opening with a conductive material with FIG. 19B illustrating a close up view of the dashed line 111 in FIG. 19A. In some embodiments, the silicide regions 133 are formed by first depositing a metal (not shown) capable of reacting with the semiconductor materials of the underlying epitaxial source/drain regions 82 (e.g., silicon, silicon germanium, germanium) to form silicide or germanide regions, such as titanium, nickel, cobalt, tantalum, platinum, tungsten, other noble metals, other refractory metals, rare earth metals or their alloys, over the exposed portions of the epitaxial source/drain regions 82, then performing a thermal anneal process to form the silicide regions 133. The un-reacted portions of the deposited metal are then removed, e.g., by an etching process. Although silicide regions 133 are referred to as silicide regions, silicide regions 133 may also be germanide regions, or silicon germanide regions (e.g., regions comprising silicide and germanide).

In a particular embodiment, the silicide region 133 comprises a titanium silicide. Further, in an embodiment in which the first implantation process 122 is performed at a power of 5.2 keV and the source/drain contact openings 114 have a width of about 42.94 nm, the titanium silicide may be formed to have a thickness of between about 3.9 nm and about 5.4 nm, such as about 4.8 nm. Additionally, in an embodiment in which the first implantation process 122 is performed at a power of 5.0 keV and the source/drain contact openings 114 have a width of about 40.22 nm, the titanium silicide may be formed to have a thickness of between about 3.8 nm and about 6.7 nm, such as about 5.3 nm. However, any suitable dimensions may be utilized.

Additionally, however, because the CESL 87 has been recessed in order to expose additional portions of the source/ drain regions 82 that are located beneath the first ILD 88, the silicide regions 133 have an increased width, such as about 43.2 nm (at a power of about 5.2 keV) or about 43.1 nm (at a power of about 5.0 keV), such that the silicide regions 133 are additionally formed between the source/drain regions 82 and the first ILD 88. For example, in some embodiments the silicide regions 133 may extend under the first ILD 88 by the second distance D2, and may also be under the second implantation region 126 of the first ILD 88, and an interface between the CESL 87 and the silicide regions 133 may extend vertically from below the second implantation region 126 of the first ILD 88 to the source/drain regions 82. However, any suitable distance and placements may be utilized.

By recessing the CESL 87 and forming the silicide regions 133 under the first ILD 88, the silicide regions 133 will have a larger width than if the CESL 87 was not recessed. Additionally, by increasing the width of the silicide regions 133, the interface between the silicide regions 133 and the underlying source/drain regions 82 is also increased. Accordingly, the overall contact area between the silicide regions 133 and the source/drain regions 82 may be enlarged through the cleaning process 129, and the device's parasitic resistance (Rp) performance can be improved.

Once the silicide regions 133 have been formed, the source/drain contact openings 114 are filled with a liner (not shown) and a conductive material. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the first ILD 88. The remaining liner and conductive material form the source/drain contacts 112 in the openings in the shape of the source/drain contact opening 114, such that the source/drain contacts 112 have a width that is less than the width of the silicide regions 133.

Figure 20B:
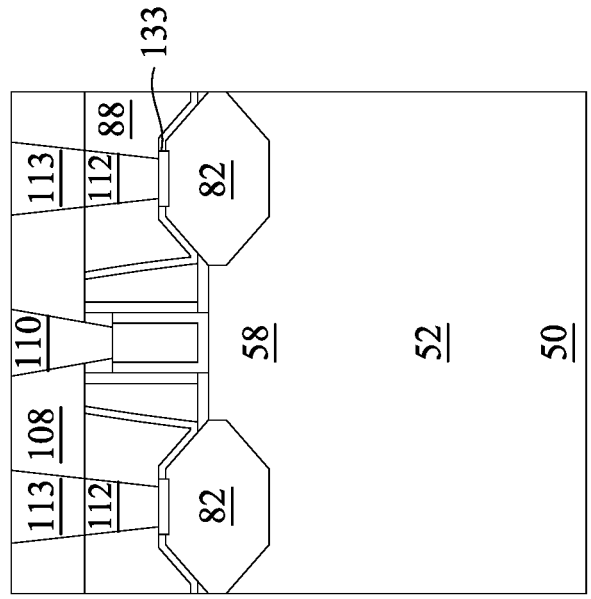
Figure 20A:
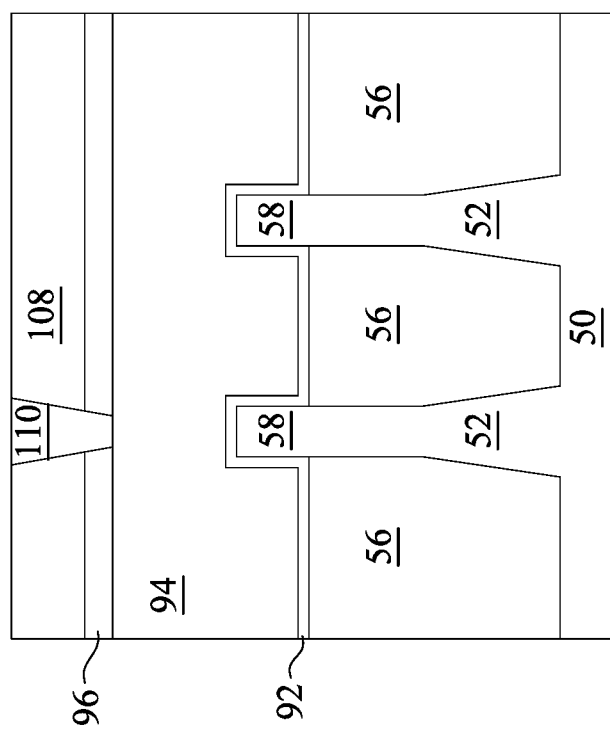

FIGS. 20A-20B illustrate formation of a second ILD 108 deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD.

FIGS. 20A-20B additionally illustrate formation of gate contacts 110 and second source/drain contacts 113 formed through the second ILD 108 in accordance with some embodiments. Openings for the second source/drain contacts 113 are formed through the second ILD 108, and openings for the gate contact 110 are formed through the second ILD 108 and the gate mask 96. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 108. The remaining liner and conductive material form the second source/drain contacts 113 and gate contacts 110 in the openings. The second source/drain contacts 113 and gate contacts 110 may be formed in different processes, or may be formed in the same process. Although shown as being formed in the same cross-sections, it should be appreciated that each of the second source/drain contacts 113 and gate contacts 110 may be formed in different cross-sections, which may avoid shorting of the contacts.

By using the implantation process in order to damage the material of the CESL 87 prior to the cleaning process 129, a portion of the material of the CESL 87 can be removed during the cleaning process 129 without extra masking or etching processes. As such, the material of the CESL 87 can be recessed even below the sidewalls of the first ILD 88 so that a subsequent formation of the silicide regions 133 can be made with a larger width than otherwise possible. Accordingly, an increased interface can lead to a lower resistance, improving the performance of the device.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

In an embodiment, a method of manufacturing a semiconductor device, the method includes: exposing a source/drain region through a first dielectric layer and a second dielectric layer, the source/drain region being located at least partially within a semiconductor fin; implanting dopants into the second dielectric layer; after the implanting the dopants, recessing the second dielectric layer beneath the first dielectric layer; and forming a silicide region on the source/drain region, wherein after the forming the silicide region the silicide region is located between the source/drain region and the first dielectric layer in a direction perpendicular to semiconductor fin. In an embodiment the recessing the second dielectric layer is performed using a wet etching process. In an embodiment the wet etching process utilizes hydrofluoric acid. In an embodiment the implanting the dopants into the second dielectric layer also implants the dopants into the first dielectric layer. In an embodiment the implanting the dopants is performed as a tilted implant. In an embodiment the implanting the dopants implants germanium. In an embodiment prior to the implanting the dopants into the second dielectric layer, the second dielectric layer extends away from the first dielectric layer.

In another embodiment, a method of manufacturing a semiconductor device, the method includes: etching a first dielectric material to form a first opening; etching a second dielectric material to extend the first opening through the second dielectric material, wherein the first opening has a first width through the first dielectric material and a second width less than the first width through the second dielectric material; recessing the second dielectric material from a sidewall of the first dielectric material to form a recess; forming a silicide within the recess and within the first opening; and filling a remainder of the first opening with a conductive material. In an embodiment, the recessing the second dielectric material comprises implanting a first dopant into the second dielectric material. In an embodiment, the first dopant comprises germanium. In an embodiment, the recessing the second dielectric material further comprises applying a wet etchant to the second dielectric material after the implanting the first dopant. In an embodiment, the wet etchant comprises hydrofluoric acid. In an embodiment, the implanting the first dopant also implants the first dopant into the first dielectric material. In an embodiment, the implanting the first dopant is performed as a tilted implant.

In yet another embodiment, a semiconductor device includes: a source/drain region located within a semiconductor fin; a first dielectric material over the semiconductor fin; a contact etch stop layer located between the first dielectric material and the semiconductor fin; and a conductive contact extending through the first dielectric material to make physical contact with a silicide region over the source/drain region, wherein the silicide region has a first width and the conductive contact has a second width adjacent to the silicide region less than the first width. In an embodiment, the first dielectric material has a first implantation region located along a sidewall of the first dielectric material adjacent to the conductive contact. In an embodiment, the contact etch stop layer has a second implantation region located along a sidewall of the contact etch stop layer. In an embodiment, the semiconductor device further includes a third implantation region located within the source/drain region, the third implantation region, the second implantation region, and the first implantation region comprise the same dopant. In an embodiment, the silicide region extends beneath the first dielectric material a distance of between about 0.5 nm and about 3 nm. In an embodiment, the second width is between about 20 nm and about 45 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   exposing a source/drain region through a first dielectric layer and a second dielectric layer, the source/drain region being located at least partially within a semiconductor fin;
   implanting dopants into the second dielectric layer;
   after the implanting the dopants, recessing the second dielectric layer beneath the first dielectric layer; and
   forming a silicide region on the source/drain region, wherein after the forming the silicide region the silicide region is located between the source/drain region and the first dielectric layer in a direction perpendicular to semiconductor fin.

2. The method of claim 1, wherein the recessing the second dielectric layer is performed using a wet etching process.

3. The method of claim 2, wherein the wet etching process utilizes hydrofluoric acid.

4. The method of claim 1, wherein the implanting the dopants into the second dielectric layer also implants the dopants into the first dielectric layer.

5. The method of claim 1, wherein the implanting the dopants is performed as a tilted implant.

6. The method of claim 1, wherein the implanting the dopants implants germanium.

7. The method of claim 1, wherein the second dielectric layer has an extension protruding from a sidewall of the first dielectric layer.

8. A method of manufacturing a semiconductor device, the method comprising:
   etching a first dielectric material to form a first opening;
   etching a second dielectric material to extend the first opening through the second dielectric material, wherein the first opening has a first width through the first dielectric material and a second width less than the first width through the second dielectric material;
   recessing the second dielectric material from a sidewall of the first dielectric material to form a recess;
   forming a silicide within the recess and within the first opening; and
   filling a remainder of the first opening with a conductive material.

9. The method of claim 8, wherein the recessing the second dielectric material comprises implanting a first dopant into the second dielectric material.

10. The method of claim 9, wherein the first dopant comprises germanium.

11. The method of claim 10, wherein the recessing the second dielectric material further comprises applying a wet etchant to the second dielectric material after the implanting the first dopant.

12. The method of claim 11, wherein the wet etchant comprises hydrofluoric acid.

13. The method of claim 9, wherein the implanting the first dopant also implants the first dopant into the first dielectric material.

14. The method of claim 9, wherein the implanting the first dopant is performed as a tilted implant.

15. A semiconductor device comprising:
   a source/drain region located within a semiconductor fin;
   a first dielectric material over the semiconductor fin;
   a contact etch stop layer located between the first dielectric material and the semiconductor fin; and
   a conductive contact extending through the first dielectric material to make physical contact with a silicide region over the source/drain region, wherein the silicide region has a first width and the conductive contact has a second width adjacent to the silicide region less than the first width, wherein the first dielectric material has a first implantation region located along a sidewall of the first dielectric material adjacent to the conductive contact.

16. The semiconductor device of claim 15, wherein the contact etch stop layer has a second implantation region located along a sidewall of the contact etch stop layer.

17. The semiconductor device of claim 16, further comprising a third implantation region located within the source/drain region, the third implantation region, the second implantation region, and the first implantation region comprise the same dopant.

18. The semiconductor device of claim 15, wherein the silicide region extends beneath the first dielectric material a distance of between about 0.5 nm and about 3 nm.

19. The semiconductor device of claim 15, wherein the second width is between about 20 nm and about 45 nm.

20. The semiconductor device of claim 15, wherein the first implantation region comprises boron.

* * * * *